(12) United States Patent
Van Oosten

(10) Patent No.: US 11,460,782 B2
(45) Date of Patent: Oct. 4, 2022

(54) MATCHING PUPIL DETERMINATION

(71) Applicant: ASML NETHERLANDS B.V., Veldhoven (NL)

(72) Inventor: Anton Bernhard Van Oosten, Lommel (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/265,632

(22) PCT Filed: Aug. 12, 2019

(86) PCT No.: PCT/EP2019/071614
§ 371 (c)(1),
(2) Date: Feb. 3, 2021

(87) PCT Pub. No.: WO2020/038756
PCT Pub. Date: Feb. 27, 2020

(65) Prior Publication Data
US 2021/0302844 A1    Sep. 30, 2021

(30) Foreign Application Priority Data

Aug. 24, 2018 (EP) .................. 18190862

(51) Int. Cl.
*G03F 7/20* (2006.01)
*G02B 26/08* (2006.01)

(52) U.S. Cl.
CPC .......... *G03F 7/70525* (2013.01); *G03F 7/705* (2013.01); *G03F 7/70116* (2013.01); *G02B 26/0833* (2013.01)

(58) Field of Classification Search
CPC .. G03F 7/70525; G03F 7/70116; G03F 7/705; G03F 7/20; G03F 7/2002;
(Continued)

(56) References Cited

U.S. PATENT DOCUMENTS 6,961,116 B2    11/2005    Den Boef et al.
7,587,704 B2    9/2009    Ye et al.
(Continued)

FOREIGN PATENT DOCUMENTS

CN    102163001    8/2011
WO    2009078708    6/2009
(Continued)

OTHER PUBLICATIONS

International Search Report and Written Opinion issued in PCT Patent Application No. PCT/EP2019/071614, dated Nov. 14, 2019.
(Continued)

*Primary Examiner* — Christina A Riddle
(74) *Attorney, Agent, or Firm* — Pillsbury Winthrop Shaw Pittman LLP

(57) ABSTRACT

A method for reducing apparatus performance variation. The method includes obtaining (i) a reference performance (e.g., CD) of a reference apparatus (e.g., a reference scanner), (ii) a set of initial leading degrees of freedom selected from a plurality of degrees of freedom of a plurality of pupil facet mirrors of an apparatus (e.g., to be matched scanner) that is selected to reproduce the reference performance, and (iii) exposure data related to one or more parameters (e.g., CD, overlay, focus, etc.) of the patterning process indicating a performance of the apparatus based on the set of initial leading degrees of freedom; and determining a matching pupil of the apparatus based on the set of initial leading degrees of freedom and the exposure data such that the matching pupil reduces a difference between the performance of the apparatus and the reference performance.

20 Claims, 11 Drawing Sheets

(58) Field of Classification Search
CPC .............. G03F 7/2008; G03F 7/70058; G03F
7/70075; G03F 7/70083; G03F
7/70091–70116; G03F 7/70125; G03F
7/70133; G03F 7/70141; G03F 7/70191;
G03F 7/702; G03F 7/70208; G03F
7/70425; G03F 7/70483–70541; G03F
7/70558; G03F 7/70616–7065; G03F
7/70666; G03F 7/70675; G03F 7/7085;
G03F 7/70975; G02B 26/0833; G02B
27/0933
USPC ........................... 355/18, 52–55, 67–71, 77;
250/492.1–492.23, 493.1, 504 r, 505.1;
430/30

See application file for complete search history.

(56) References Cited

U.S. PATENT DOCUMENTS

| | | |
|---|---|---|
| 2006/0066855 A1 | 3/2006 | Den Boef et al. |
| 2009/0157360 A1 | 6/2009 | Ye et al. |
| 2011/0027704 A1 | 2/2011 | Cramer et al. |
| 2011/0043791 A1 | 2/2011 | Smilde et al. |
| 2011/0205510 A1 | 8/2011 | Menchtchikov et al. |
| 2012/0229786 A1* | 9/2012 | Engelen .................. G03F 7/705 355/67 |
| 2012/0242970 A1 | 9/2012 | Smilde et al. |
| 2012/0327383 A1 | 12/2012 | Cao et al. |
| 2015/0323786 A1 | 11/2015 | Kita |
| 2016/0258810 A1 | 9/2016 | Van Der Post |
| 2016/0297117 A1 | 10/2016 | Sato et al. |

FOREIGN PATENT DOCUMENTS

| | | |
|---|---|---|
| WO | 2009106279 | 9/2009 |
| WO | 2013013894 | 1/2013 |
| WO | 2016184743 | 11/2016 |

OTHER PUBLICATIONS

European Search Report issued in European Patent Application No. 18190862, dated Feb. 19, 2019.

McIntyre, G. et al.: "Qualification, Monitoring, and Integration into a Production Environment of the World's First Fully Programmable Illuminator", Proc. of SPIE, vol. 7973 (2011).

Chinese Office Action issued in corresponding Chinese Patent Application No. 201980055414.5, dated Apr. 6, 2022.

* cited by examiner

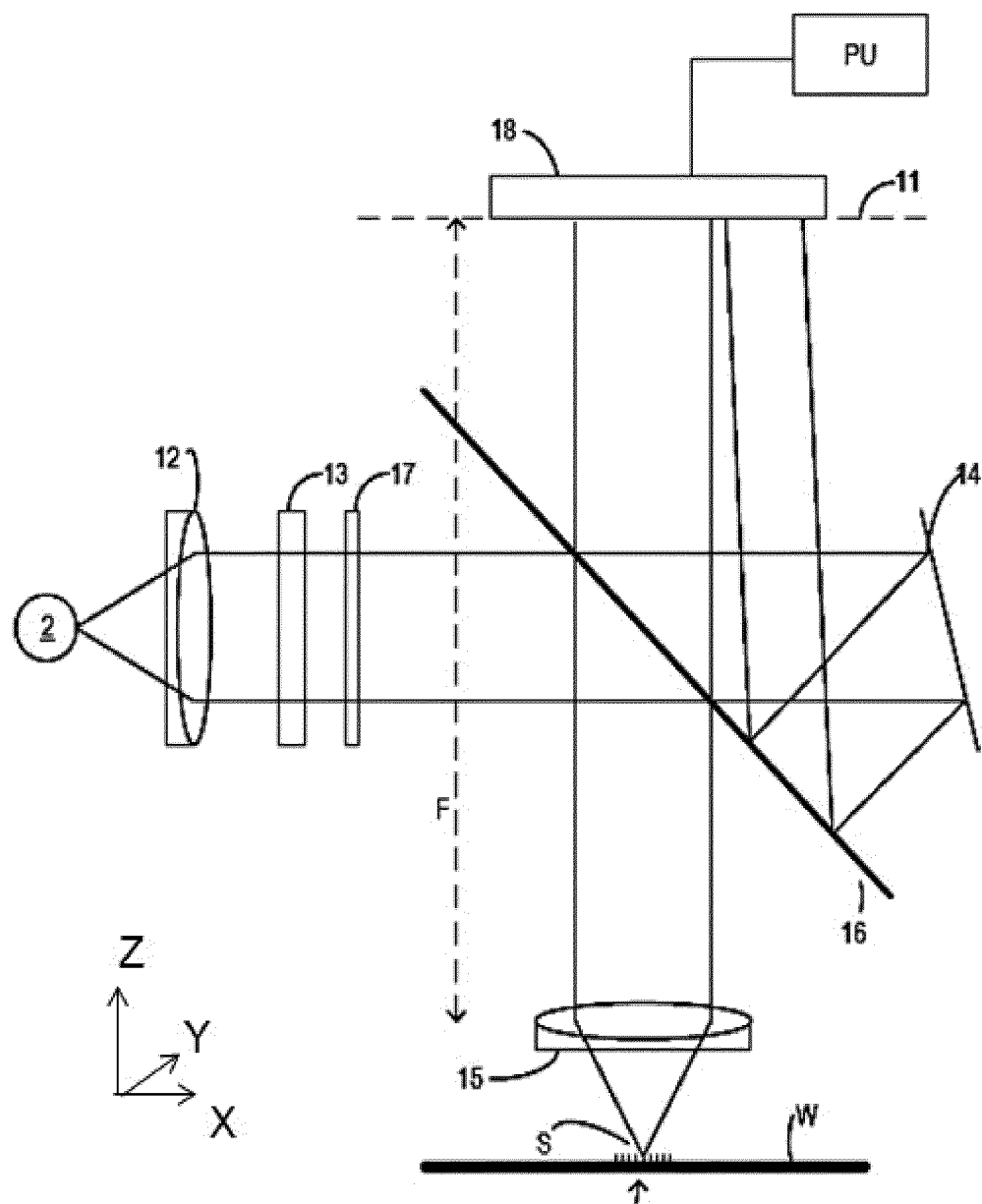
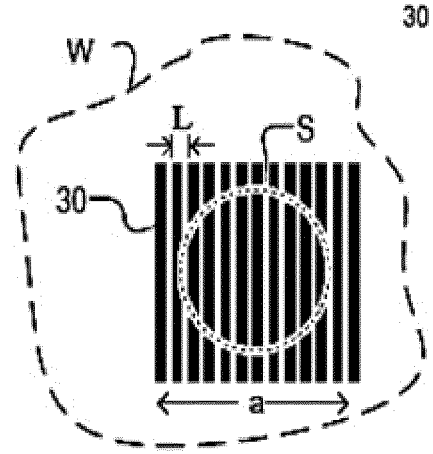
Fig. 4
Fig. 5

MATCHING PUPIL DETERMINATION

CROSS-REFERENCE TO RELATED APPLICATIONS

This application is the U.S. national phase entry of PCT Patent Application No. PCT/EP2019/071614, which was filed on Aug. 12, 2019, which claims the benefit of priority of European Patent Application No. 18190862.5, which was filed on Aug. 24, 2018, and which is incorporated herein in its entirety by reference.

FIELD

The present disclosure relates to techniques of improving the performance of a device manufacturing process. The techniques may be used in connection with a lithographic apparatus or a metrology apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

According to an embodiment, there is provided a method for reducing apparatus performance variation. The method includes obtaining (i) a reference performance of a reference apparatus, (ii) a set of initial leading degrees of freedom selected from a plurality of degrees of freedom of a plurality of pupil facet mirrors of an apparatus that is selected to reproduce the reference performance, and (iii) exposure data related to one or more parameters of the patterning process indicating a performance of the apparatus based on the set of initial leading degrees of freedom; and determining, by a computer system, a matching pupil of the apparatus based on the set of initial leading degrees of freedom and the exposure data such that the matching pupil reduces a difference between the performance of the apparatus and the reference performance.

In an embodiment, the matching pupil is a subset and/or entire set of the plurality of pupil facet mirrors corresponding to the set of initial leading degrees of freedom.

In an embodiment, the determining of the matching pupil is an iterative process, an iteration includes changing one or more degrees of freedom of the set of leading degrees of freedom of the plurality of pupil facet mirrors based on a difference between the reference performance and the reference performance; obtaining a current performance from the exposure data corresponding to the changed pupil facet mirrors; and determining a current difference between the current performance and the reference performance.

In an embodiment, the changing one or more degrees of freedom include a change in orientation and/or intensity of one or more mirrors corresponding to the set of leading degrees of freedom.

In an embodiment, the set of initial leading degrees of freedom is selected based on a sensitivity of each degree of freedom of the degrees of the plurality of pupil facet mirrors of the apparatus to reproduce the reference performance.

In an embodiment, the set of initial leading degrees of freedom is a subset and/or an entire set of the plurality of degrees of freedom of the plurality of pupil facet mirrors the apparatus that matches the reference performance.

In an embodiment, the exposure data is obtained for a linear combination of the set of initial leading degrees of freedom.

In an embodiment, the reference performance is a performance of the reference apparatus different from the apparatus.

In an embodiment, the reference performance is a performance of the apparatus determined at a particular time of the patterning process.

In an embodiment, the performance of the apparatus and the reference performance of the reference apparatus are related to a parameter of the patterning process including critical dimension and/or overlay.

In an embodiment, the matching pupil minimizes the difference between the performance of the apparatus and the reference performance.

In an embodiment, the method further includes adjusting the performance of the apparatus based on the matching pupil of the apparatus of the patterning process.

In an embodiment, the apparatus of the patterning process is a lithographic apparatus.

Furthermore, according to an embodiment, there is provided a method for reducing apparatus performance variation. The method includes obtaining (i) a reference performance of a reference apparatus, and (ii) pupil measurements of a mirror of a plurality of pupil facet mirrors of an apparatus at a substrate level, determining, by a computer system, imaging data based on the pupil measurements and a performance based on the imaging data; and determining, by the computer system, a matching pupil of the apparatus such that the matching pupil reduces a difference between the performance of the apparatus and the reference performance.

In an embodiment, the determining of the matching pupil is an iterative process, an iteration includes changing one or more degrees of freedom of the plurality of pupil facet mirrors; computing, via modeling/simulation, a current aerial image and a current performance based on the changed pupil facet mirrors; and determining a current difference between the current performance and the reference performance.

In an embodiment, the changing one or more degrees of freedom include a change in orientation and/or intensity of one or more mirrors of the plurality of pupil facet mirrors.

In an embodiment, the pupil measurements include intensity and/or orientation of one or more mirrors of the plurality of pupil facet mirrors.

In an embodiment, the reference performance is measured from a reference imaging data for a reference apparatus, the reference apparatus being different from the apparatus.

In an embodiment, the reference performance is a measured from a reference imaging data for the apparatus determined at a particular time of the patterning process.

In an embodiment, the reference imaging data is generated by superimposing aerial images of each mirror of the plurality of pupil facet mirror.

In an embodiment, the aerial images are generated, by modeling and/or simulation, for a far field location at a substrate level.

In an embodiment, the imaging data is generated by superimposing aerial images of each mirror of the plurality of pupil facet mirror, the aerial image being computed based on the intensity measurement of each mirror of the plurality of pupil facet mirrors.

In an embodiment, the performance and the reference performance are related to a parameter of the patterning process including critical dimension and/or overlay.

In an embodiment, the matching pupil minimizes the difference between the performance of the apparatus and the reference performance.

In an embodiment, the method further includes adjusting the performance of the apparatus based on the matching pupil of the apparatus of the patterning process.

In an embodiment, the apparatus of the patterning process is a lithographic apparatus.

Disclosed herein is a computer program product comprising a computer readable medium having instructions recorded thereon, the instructions when executed by a computer implementing a method herein.

The foregoing general description of the illustrative implementations and the following detailed description thereof are merely exemplary aspects of the teachings of this disclosure, and are not restrictive.

BRIEF DESCRIPTION OF THE DRAWINGS

FIG. 4 schematically depicts an example inspection apparatus.

FIG. 5 illustrates the relationship between an illumination spot of an inspection apparatus and a metrology target.

DETAILED DESCRIPTION

Before describing embodiments in detail, it is instructive to present an example environment in which embodiments may be implemented.

Figure 1:
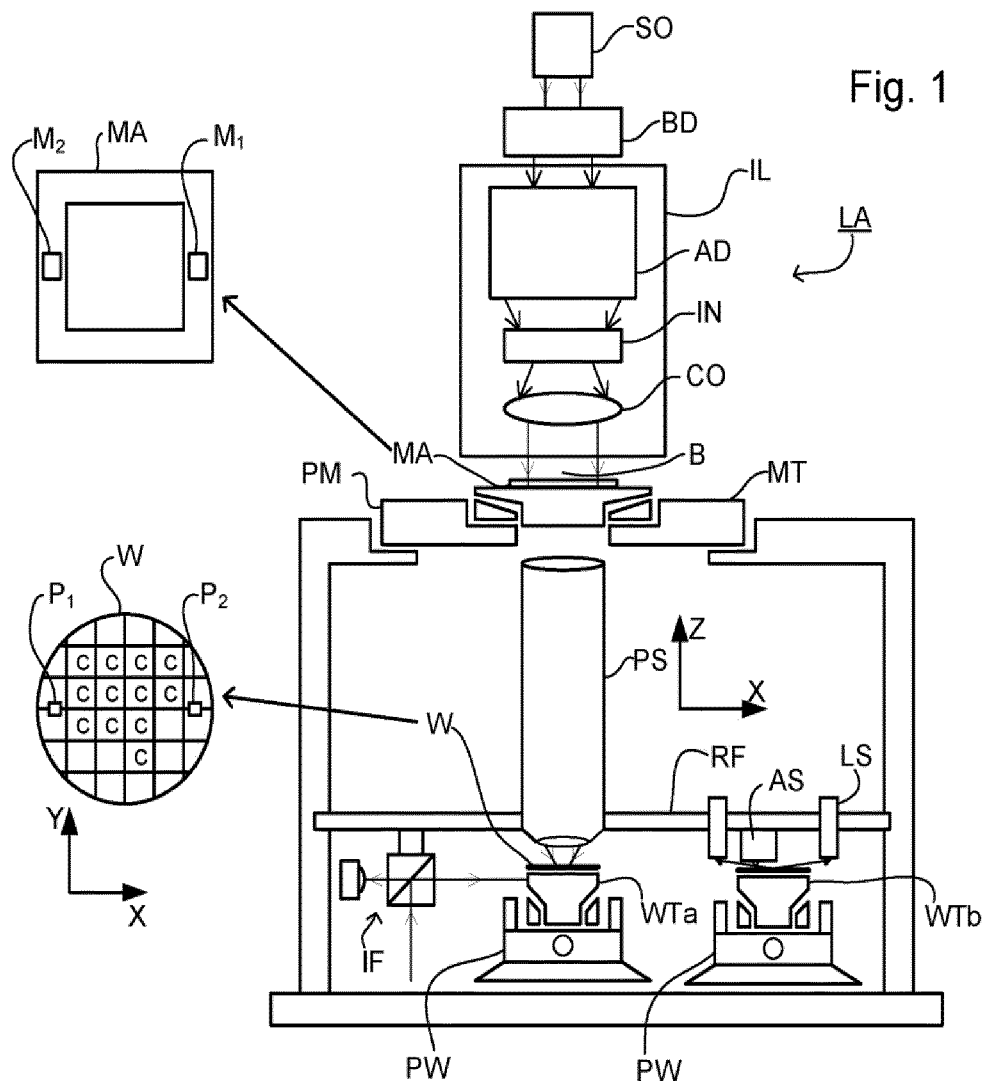
FIG. 1 schematically depicts a lithography apparatus according to an embodiment.

FIG. 1 schematically depicts an embodiment of a lithographic apparatus LA. The apparatus comprises:
- an illumination system (illuminator) IL configured to condition a radiation beam B (e.g. UV radiation, EUV or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator IL can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
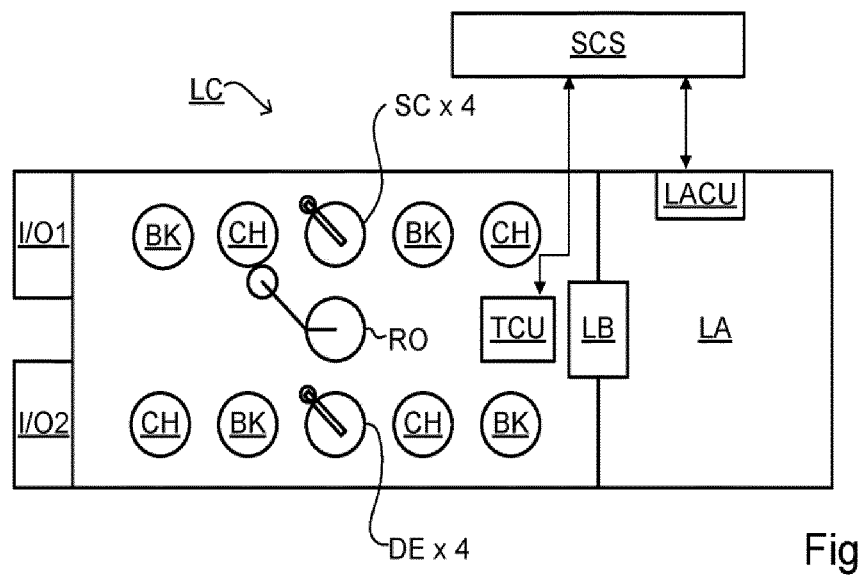
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
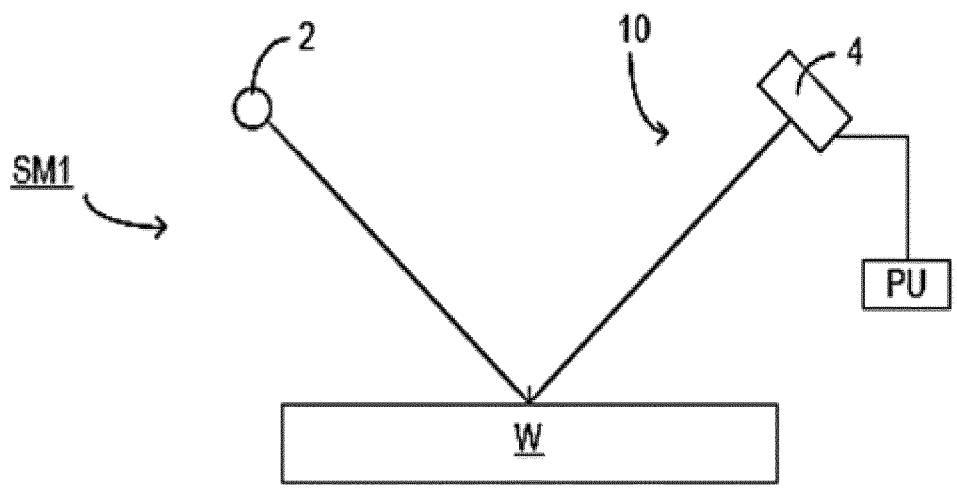
FIG. 3 schematically depicts an example inspection apparatus and metrology technique.
Figure 3:
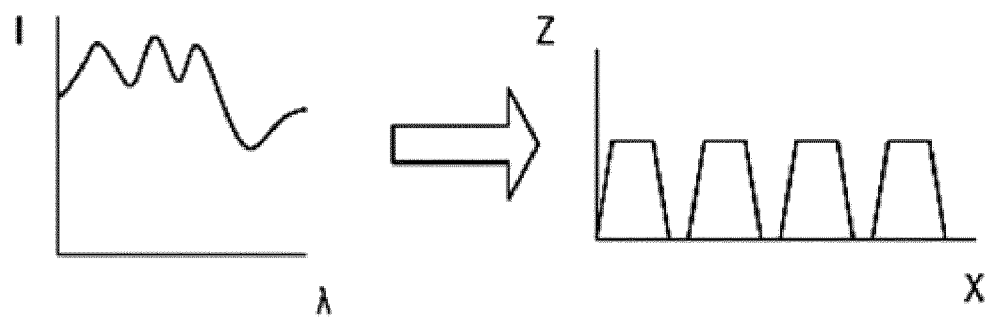

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
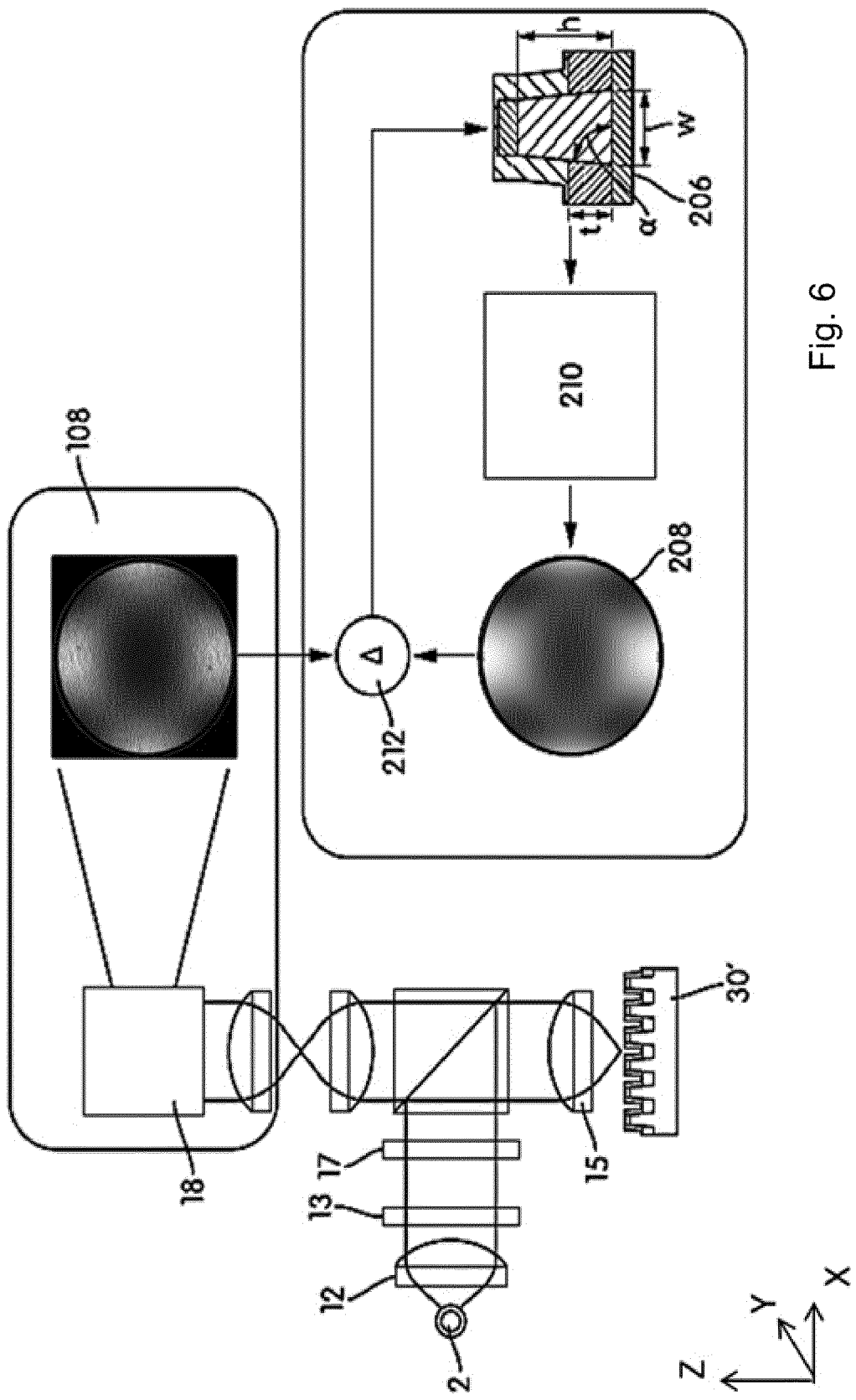
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
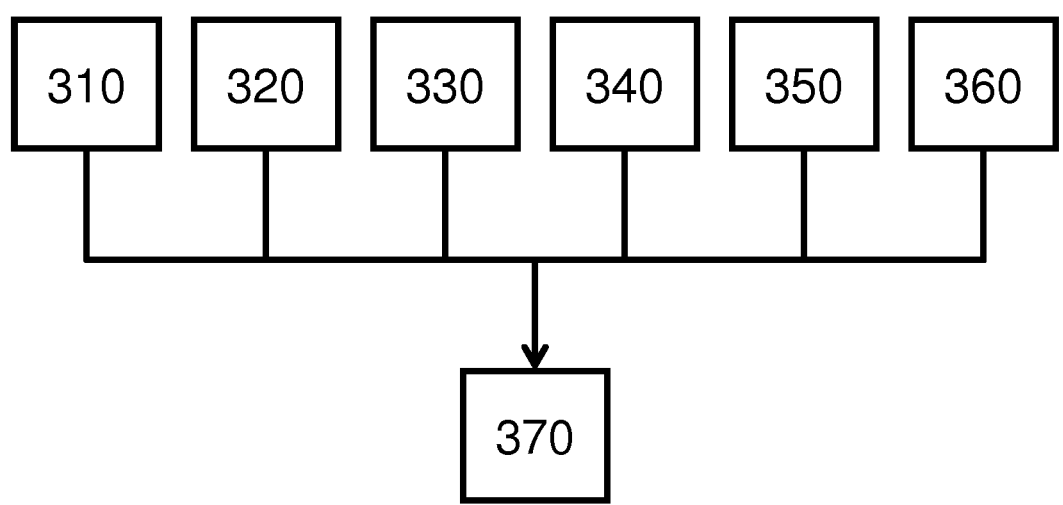
FIG. 7 shows example categories of processing variables.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Figure 8:
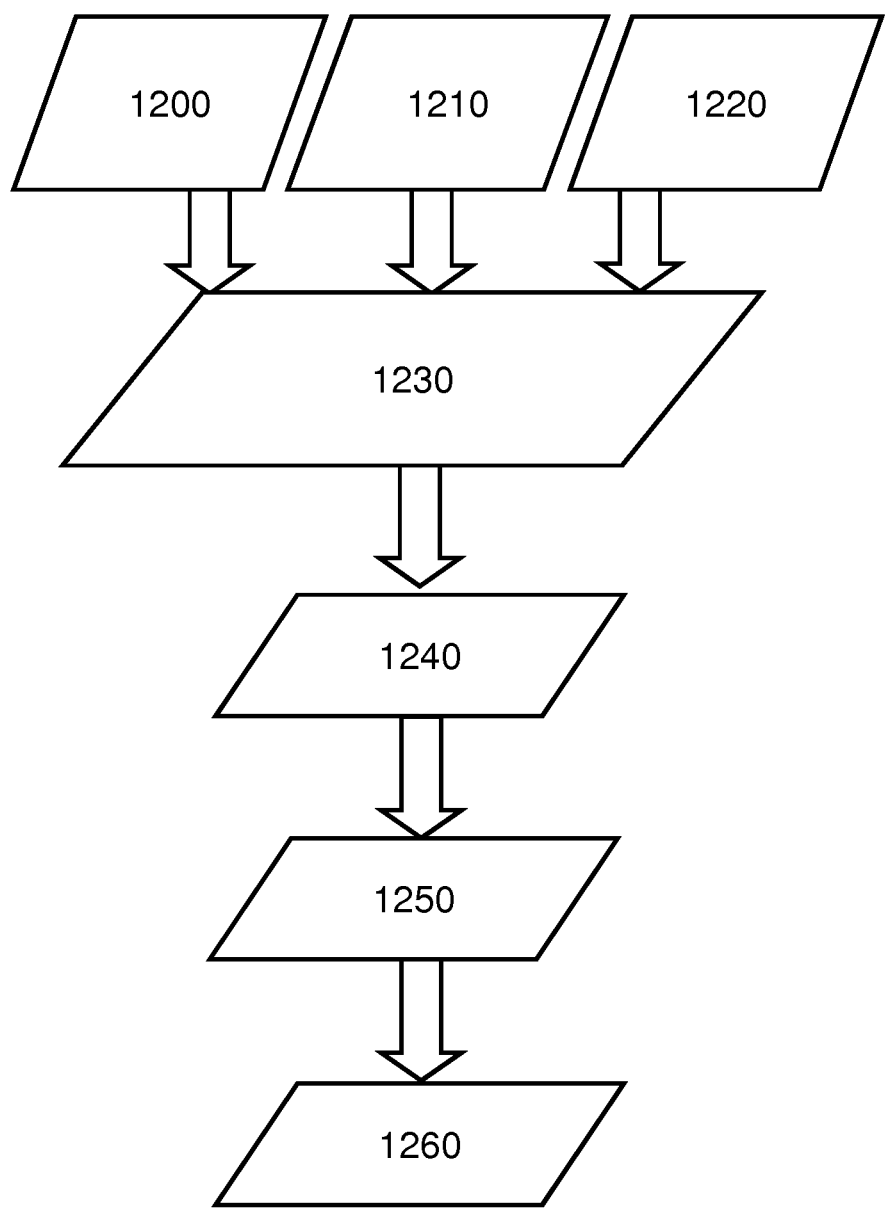
FIG. 8 schematically shows a flow for a method, according to an embodiment.

An exemplary flow chart for modelling and/or simulating parts of a patterning process is illustrated in FIG. 8. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where 6 (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Figure 9:
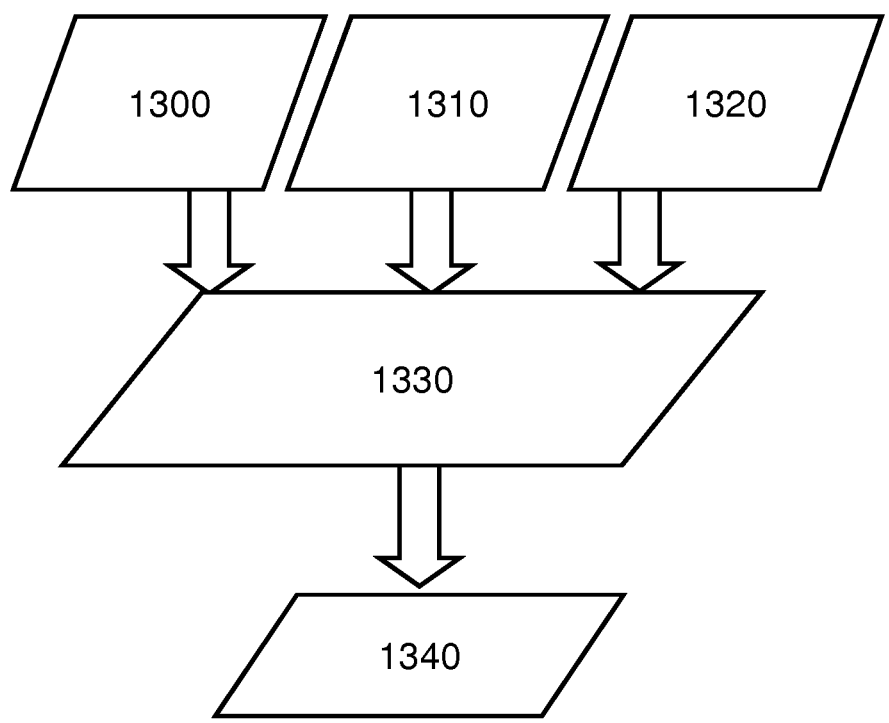
FIG. 9 schematically shows a flow for a method, according to an embodiment.

An exemplary flow chart for modelling and/or simulating a metrology process is illustrated in FIG. 9. As will be appreciated, the following models may represent a different metrology process and need not comprise all the models described below (e.g., some may be combined). A source model 1300 represents optical characteristics (including radiation intensity distribution, radiation wavelength, polarization, etc.) of the illumination of a metrology target. The source model 1300 can represent the optical characteristics of the illumination that include, but not limited to, wavelength, polarization, illumination sigma ($\sigma$) settings (where $\sigma$ (or sigma) is a radial extent of illumination in the illuminator), any particular illumination shape (e.g. off-axis radiation shape such as annular, quadrupole, dipole, etc.), etc.

A metrology optics model 1310 represents optical characteristics (including changes to the radiation intensity distribution and/or the phase distribution caused by the metrology optics) of the metrology optics. The metrology optics 1310 can represent the optical characteristics of the illumination of the metrology target by metrology optics and the optical characteristics of the transfer of the redirected radiation from the metrology target toward the metrology apparatus detector. The metrology optics model can represent various characteristics involving the illumination of the target and the transfer of the redirected radiation from the metrology target toward the detector, including aberration, distortion, one or more refractive indexes, one or more physical sizes, one or more physical dimensions, etc.

A metrology target model 1320 can represent the optical characteristics of the illumination being redirected by the metrology target (including changes to the illumination radiation intensity distribution and/or phase distribution caused by the metrology target). Thus, the metrology target model 1320 can model the conversion of illumination radiation into redirected radiation by the metrology target. Thus, the metrology target model can simulate the resulting illumination distribution of redirected radiation from the metrology target. The metrology target model can represent various characteristics involving the illumination of the target and the creation of the redirected radiation from the metrology, including one or more refractive indexes, one or more physical sizes of the metrology, the physical layout of the metrology target, etc. Since the metrology target used can be changed, it is desirable to separate the optical properties of the metrology target from the optical properties of the rest of the metrology apparatus including at least the illumination and projection optics and the detector. The objective of the simulation is often to accurately predict, for example, intensity, phase, etc., which can then be used to derive a parameter of interest of the patterning process, such overlay, CD, focus, etc.

A pupil or aerial image 1330 can be simulated from the source model 1300, the metrology optics model 1310 and the metrology target model 1320. A pupil or aerial image is the radiation intensity distribution at the detector level. Optical properties of the metrology optics and metrology target (e.g., properties of the illumination, the metrology target and the metrology optics) dictate the pupil or aerial image.

A detector of the metrology apparatus is exposed to the pupil or aerial image and detects one or more optical properties (e.g., intensity, phase, etc.) of the pupil or aerial image. A detection model module 1320 represents how the radiation from the metrology optics is detected by the detector of the metrology apparatus. The detection model can describe how the detector detects the pupil or aerial image and can include signal to noise, sensitivity to incident radiation on the detector, etc. So, in general, the connection between the metrology optics model and the detector model is a simulated pupil or aerial image, which arises from the illumination of the metrology target by the optics, redirection of the radiation by the target and transfer of the redirected radiation to the detectors. The radiation distribution (pupil or aerial image) is turned into detection signal by absorption of incident energy on the detector.

Simulation of the metrology process can, for example, predict spatial intensity signals, spatial phase signals, etc. at the detector or other calculated values from the detection system, such as an overlay, CD, etc. value based on the detection by the detector of the pupil or aerial image. Thus, the objective of the simulation is to accurately predict, for example, detector signals or derived values such overlay, CD, corresponding to the metrology target. These values can be compared against an intended design value to, e.g., correct the patterning process, identify where a defect is predicted to occur, etc.

Thus, the model formulation describes most, if not all, of the known physics and chemistry of the overall metrology process, and each of the model parameters desirably corresponds to a distinct physical and/or chemical effect in the metrology process.

As mentioned earlier, the patterning process may involve one or more apparatus that may operate in parallel to produce similar substrates. Over a period of time, performance of one or more apparatus may change leading to inconsistencies (e.g., in terms of CD of same feature) between substrates produced by different apparatus or the same apparatus. The performance of the apparatus may be characterized in terms of the parameter of the patterning process. In an embodiment, a performance of an apparatus may vary due to difference in pupil between one apparatus versus other, or difference in pupil of one apparatus over a period of time/processing steps.

A pupil of an apparatus may be part of the illuminator IL of FIG. 1, more particularly the beam deliver system BDS as discussed earlier. The pupil may consists of a plurality of pupil facet mirrors that can be adjusted (e.g., by adjustor mechanism AM) to change the intensity and/or orientation of one or more mirrors to generate different illumination patterns such as dipole, quadrapole, etc. Over a period of time, as the pupil degrades, the same pattern may deliver different performance for the same apparatus. Also, the pupil on one apparatus may not be the same as on the other apparatus due to variation in, for example, a manufacturing process of the apparatus itself or material of the pupil.

Pupil matching may be desired to maintain a consistent output (e.g., substrates with desired pattern with minimum variation between different substrates) may be obtained from different apparatus or the same apparatus over a period of time or over multiple patterning steps. The foregoing disclosure describes methods to obtain pupil matching. Pupil matching refers to a pupil configuration (e.g., list of mirrors having certain intensities and/or orientation) of an apparatus that generates a performance (e.g., CD of a feature) of the apparatus that is similar to a reference performance. In an embodiment, the pupil matching may be performed between two apparatuses or the same apparatus at different points in time of the patterning process.

Figure 10:
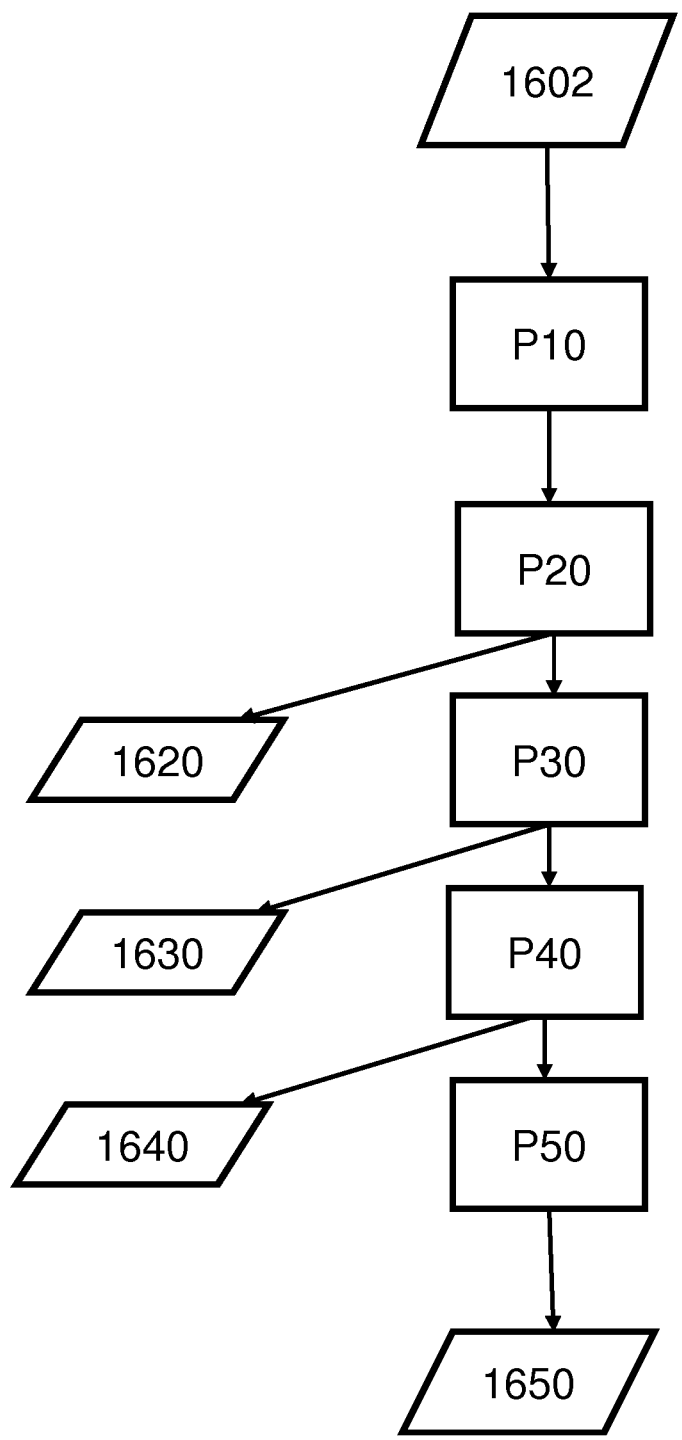
FIG. 10 is a flow chart for determining matching pupil according to an embodiment.

FIG. 10 is a flow chart of a pupil matching method according to an embodiment of the present disclosure. The pupil matching may be based on determining a set of initial leading degrees of freedom of pupil facet mirrors and modifying/adjusting the initial leading DoF so that the apparatus generates a performance that closely resembles to the reference performance.

In process P10, a reference performance 1602 may be obtained for a reference apparatus. The reference apparatus may be one of a plurality of the apparatuses of the patterning process against with a performance of remaining apparatus may be compared and/or the reference apparatus may be same apparatus whose performance may be compared to itself at different points in time (e.g., at a beginning, at a middle, or at an end) of the patterning process.

In an embodiment, a reference performance may be a performance that closely (e.g., within 0-5% of desired value) resembles an ideal and/or design intent. The performance may be expressed in terms of a value or a set of values associated with one or more parameters (e.g., CD, overlay, etc.) of the patterning process. For example, the reference performance may be a desired CD value of a feature (e.g., a CD of 10 nm for a contact hole, or a CD of 25 nm for a bar or pillar, etc.), a range of CD values associated with one or more features, or other design specification typically used define a performance of an apparatus. In an embodiment, the reference performance may be determined with respect to a first apparatus (e.g., a first scanner of the patterning process), such reference performance may serve as a reference for a second apparatus (e.g., a second scanner of the patterning process). Such reference performance may or may not be close to ideal, but simply serves as a reference to enable matching with the performance of the second apparatus. In another embodiment, the reference performance may be determined from the second apparatus at a particular point in time, for example, at a beginning of the patterning process; such reference performance may be serve as a reference for the same apparatus at a different point in time (e.g., at a middle of the patterning process, a time when 500, 1000, 5000, 10,000, etc. wafers are produced). Also, the reference performance obtained from the second apparatus may or may not be close to ideal, but simply serves as a reference to enable matching with the performance of the second apparatus at different points in time.

In an embodiment, the reference performance may be measured (e.g., using metrology tools) from the substrate produced by the first apparatus (or the second apparatus, e.g., at the beginning of the patterning process). In an embodiment, the reference data may be modeled and/or simulated assuming ideal conditions or realistic conditions based on populations of tools or predictions thereof.

Once the reference performance (e.g., corresponding to a specific pupil facet mirror with respect to the first apparatus) is obtained, in process P20, pupil data 1620 (also referred as a first set of degrees of freedom or reference pupil data) for the apparatus (e.g., a second apparatus) that produces a matching performance with the reference performance (e.g., with respect to the first apparatus) may be obtained. A pupil has several degrees of freedom (e.g., 300×300, 400×400, 500×500, 1000×1000, 2000×2000, 3000×3000, etc.), each degree of freedom corresponds to a specific (or possible) states of the mirror of pupil facet mirrors. The pupil facet mirrors is a set of mirrors arranged in an array, in which each mirror may be connected to an actuating device controlled by a controller, which may be configured to control the intensity and/or orientation of the mirror.

In an embodiment, the pupil data generally refers to a list of mirrors or the degrees of freedom of interest of the pupil facet mirror of the apparatus (e.g., the second apparatus) for which a matching pupil is to be determined. For example, reference pupil data of the apparatus may be a list of mirrors and their configuration within the pupil facet mirrors that produces a match with the reference performance. The pupil data may include all the mirrors of the pupil facet mirrors, or a subset thereof. Furthermore, for each mirror of the pupil data, an intensity of each mirror, and/or orientation of each mirror may be included in the pupil data. In an embodiment, a mirror of the pupil facet mirror has one or more discrete states (e.g., "on" or "off"), thus the pupil data may include discrete states corresponding to a specific mirror. Furthermore, each state of the mirror may correspond to an aerial image. Based on the individual aerial images corresponding to the pupil facet mirrors, a total aerial image of the pupil may be generated, for example, by summation or superimposition of the aerial images of the individual mirrors. Thus, pupil data may include discrete states of each mirror of the pupil facet mirror, aerial images corresponding to the each mirror, and/or a total aerial image constructed from the individual aerial images. In an embodiment, the discrete state of a mirror or the intensity value of a mirror can be correlated to an aspect of a feature (e.g., an edge of a bar, circumference of a contact hole) of the substrate. In an embodiment, the correlation between discrete state or the intensity of the individual mirrors may be established, for example, via simulation of a process model such as a resist and/or an etch model or based on measurements of the printed substrate.

In an embodiment, the aerial image generated by each mirror also depends on a pattern/feature to be imaged on the substrate and optical parameters (NA, aberrations, magnification, apodisation, focus, etc.). Thus, in an embodiment, an aerial image per mirror may also correspond to or correlated to data/values of the optical parameters. Thus, the pupil data may also include such aerial image data per mirror.

In an embodiment, the pupil data may be limited to a region of interest based on a merit function. The merit function may be a function of CD, overlay or other parameters of the patterning process. Thus, if one is interested in comparing performances with respect to a particular pattern, or an aspect of a feature (e.g., an edge), then the pupil data may be restricted or limited to data of mirrors correlated to the region of interest (e.g., the edge). As such, according to an embodiment, the pupil data can directly generate images (e.g., aerial image) without using or referring to a design layout of a pattern to be printed on the substrate.

A list of mirrors may define a desired illumination pattern that will eventually result in the reference performance of the apparatus. However, during the pattering process, the performance of the apparatus (e.g., the second apparatus) may drift/deviate/may not be consistent (e.g., due to collector degradation in EUV lithography, or pupil degradation in due to use) with the other apparatus(es) (e.g., the first apparatus), as such one or more mirrors of the reference pupil data that matches the reference performance may need to be adjusted to maintain or closely resemble the reference performance.

Further, in process P30, the degrees of freedom (e.g., number of mirrors and related parameters such as intensity and orientation) of the reference pupil data may be adjusted based on a set of initial leading degrees of freedom (DoFs) within the reference pupil data. Initial leading DoFs 1630 refers to one or more mirrors of the reference pupil data that has a relatively high sensitivity/impact to the performance of the apparatus. Such leading DoFs 1630 may be identified by modeling and/or simulation of a relationship defined between the pupil data and the performance of the apparatus. Such relationship may be statistical in nature and/or include physics based modeling/simulation. Based on the modeling/simulation, a sensitivity of each mirror to the performance of the apparatus may be determined. For example, a singular decomposition technique may be used to determine sensitivity of each DoF to the performance. In another example, following equation may be used to determine the sensitivity of each DoF:

$$P = a_1 \cdot DoF_1 + a_2 \cdot DoF_2 + a_3 \cdot DoF_3 + \ldots + a_n \cdot DoF_n \qquad (1)$$

In the equation (1) above, (i) P refers to a performance parameter (e.g., CD), (ii) $a_n$ refers to sensitivity of $n^{th}$ mirror of the list of mirrors; and (iii) $DoF_n$ refers to the degree of freedom. The present disclosure is not limited to above equation (1) to determine the sensitivity of a DoF, and other techniques related to sensitivity analysis such as variance decomposition, partial derivative effect, scatter plot, regression analysis, screening, etc. may be used.

Further, based on the sensitivity of each DoF, the initial leading DoFs may be selected that have relatively high sensitivity compared to the other DoFs within the list of mirrors. In an embodiment, a predetermined number of DoFs may be selected as the leading DoFs, for example, up to 10% of the total degrees of freedom, up to 100 DoF, etc. In an embodiment, the leading DoFs may be based on sensitivity values itself, for example, leading DoFs having sensitivity of more than a predetermined threshold (e.g., more than 90%) may be selected. In another embodiment, the leading DoFs may be selected based on a location of the mirrors within the pupil facet mirrors. For example, mirrors around a center of the pupil facet mirrors may have higher preference (e.g., relatively higher weight) compared to mirrors at a periphery of the pupil facet mirror. In an embodiment, for example, within the pupil facet mirrors having a 400×400 DoF, the selected leading DoFs may be 10, 20, 30, 45, etc. number of mirrors.

Furthermore, in process P40, exposure data 1640 of one or more parameters (e.g., CD, overlay, focus, etc.) may be obtained for one or more substrates. The substrates may be exposed to determine or probe an impact of the leading DoF (e.g., 10) of the pupil on the performance of the apparatus. In an embodiment, the one or more substrates may be exposed using the pupil data 1620 and/or with the leading DoF 1630 of the pupil data 1620. In an embodiment, the probing may involve selection of a linear combination of the leading DoFs 1630, exposing the one or more substrates with the linear combination of the leading DoFs, and measuring the performance (e.g., CD values) for a single exposure of the one or more substrates. For example, if the leading DoFs includes 10 mirrors, then the linear combination may be include all 10 mirrors and/or a subset (or sub combinations) of the 10 mirrors such as 1st, 3nd and 9th mirror out of the 10 mirrors, which may even be represented in terms of sets e.g., [1,3,9], [2,4,6], [5,6,7,8], [1,2,3,4], and so on. Each linear combination of the leading DoFs may result in different performance of the apparatus. Such exposure data 1640 may be collected to further determine, in process P50, a matching pupil may be determined. A matching pupil refers to a set of mirrors of the pupil facet mirrors selected from the leading DoFs that causes an apparatus performance to closely resemble the reference performance.

In process P50, based on the exposure data 1640, a matching pupil 1650 (e.g., one of the linear combinations of the mirrors) may be determined based on a difference (e.g. ΔCD) between the performance obtained based on the linear combination of the leading DoFs 1630 and the reference performance 1602. For example, the matching pupil 1650 may be a list of mirrors that reduces, preferably minimizes the difference. Hence, by controlling the matching pupil, the performance of the apparatus (e.g., the second apparatus) may be substantially similar to a reference apparatus (e.g., the first apparatus). Thereby, a consistent performance throughout the patterning process may be observed and/or achieved based on the matching pupil for one or more apparatus of the patterning process using method as discussed above.

In an embodiment, the determining of the matching pupil 1650 may involve an iterative process. Each iteration may include changing one or more degrees of freedom of the leading DoFs 1630 of the pupil facet mirrors, obtaining a current performance from the exposure data corresponding to the changed pupil facet mirrors; and determining a current difference between the current performance and the reference performance. The changing one or more degrees of freedom may include a change in orientation and/or intensity of one or more mirrors of the leading degrees of freedom. In an embodiment, the one or more degrees of freedom may be a linear combination of the leading DoFs 1630. In an embodiment, the one or more degrees of freedom to change may be selected based on a location of the mirror of the mirrors within the pupil facet mirrors. For example, the intensity of the mirrors may be changed to form a dipole, quadrupole, etc. illumination type. For each illumination type, a different performance may be observed. The difference in performance with respect to the reference performance for each linear combination of may be stored and used to determine the matching pupil associated with minimum difference.

In an embodiment, the minimum difference may be based on performance (e.g., CD) related to a particular feature (e.g. contact holes of diameter 10 nm) or multiple features (e.g., contact holes of sizes 10 nm, 15 nm, 20 nm, 25 nm, 40 nm, 50 nm, etc.). In an embodiment, a difference in performance for each feature of a plurality of features (e.g., contact holes of sizes 10 nm, 15 nm, 20 nm, 25 nm, 40 nm, 50 nm, etc.) may be computed. Then, in an example, the minimum difference may be defined as a minimum of a sum of the differences for each feature. For example, for each of a linear combination of the leading DoFs, the sum of the differences for a plurality of features may be computed and the linear combination having the least of the sum of the difference may be selected as the matching pupil.

In an embodiment, other appropriate way to calculate the difference may be used. For example, a statistical mean or variance may be used to compute a difference in performance for each feature. In such a case, a minimum difference may be related a linear combination showing least variation in performance for each feature.

Furthermore, the performance parameter may be a combination of parameters of the patterning process, for example, CD and Overlay. For example, a CD of 25 nm, an overlay may be ±0.5 nm. In such a case, the difference may be computed for each parameter and a minimum difference may be determined based on one parameter and/or a combination of parameters. For example, difference in CD, difference in overlay, or a difference in both CD and overlay may be considered to determine the minimum difference.

It can be appreciated that the present disclosure is not limited to performance parameter CD, but other appropriate parameters (e.g., overlay, focus, etc.) of the patterning process may be selected to determine the performance of the apparatus.

In an embodiment, the pupil data (or the matching pupil data) can be further used in the source optimization (SO) process or the source mask optimization (SMO). For example, the matching pupil may be an input to the source mask optimization model that determines an optimum source based on the matching pupil. In an embodiment, during SO or SMO the pupil may be further optimized, In an embodiment, the optimized pupil may be further used to determine optical proximity corrections, via process model simulation.

Figure 11:
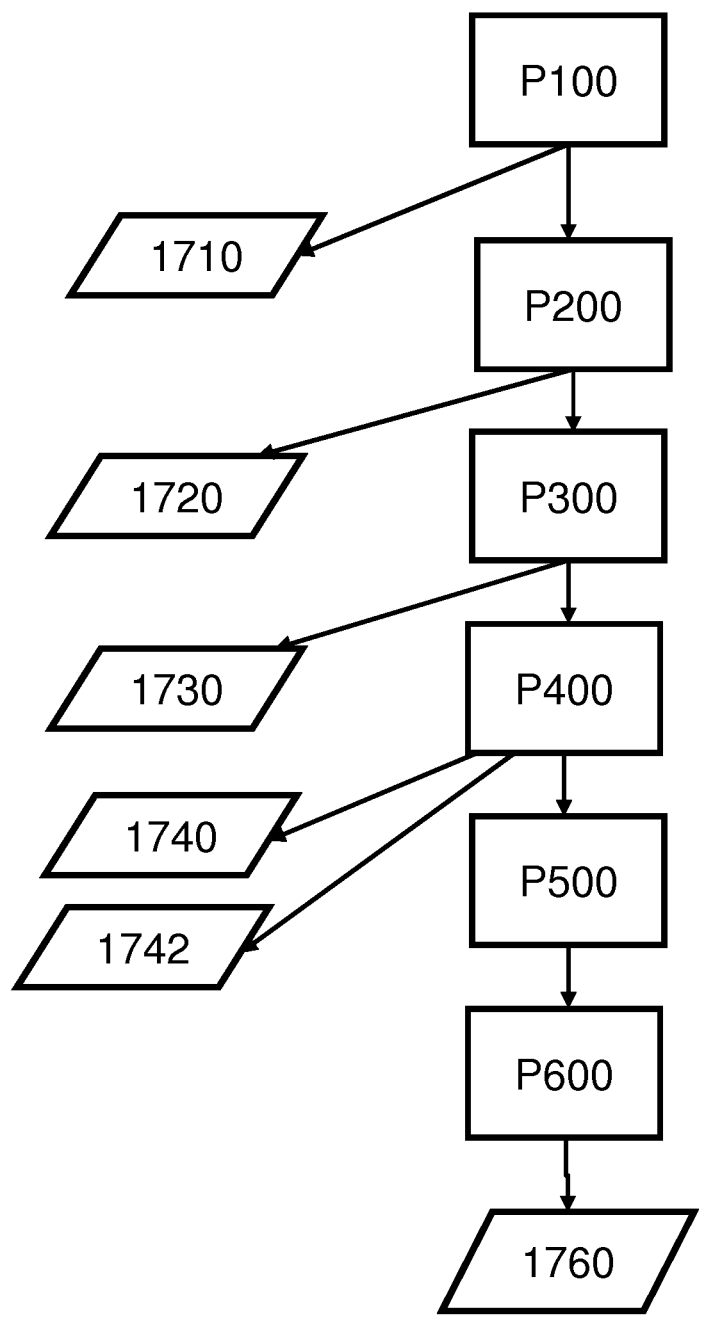
FIG. 11 is a flow chart for another method of determining matching pupil according to an embodiment.

In an embodiment, a pupil matching may be performed according to method of FIG. 11. According to the method in FIG. 11, the pupil matching may be based on computation and comparison of, for example, aerial imaging data at a far field (e.g., at a substrate level). In embodiment, the pupil matching may be based on an appearance of the pupil, for example, it may be desired to have all the pupil facet mirrors to have a particular intensity; however, over a period of time due to degradation, for example, certain mirrors may have low or zero intensity. Intensity at the pupil may be measured, for example, using a tool such as LEUP and an aerial image can be reconstructed, by modeling and/or simulation (e.g., using projection optics model, aerial imaging model, etc.), from the intensity measurement data. The method of FIG. 11 may provide an inline calibration and/or correction to the pupil to maintain the performance of the apparatus over a period of time and/or reduces, preferably minimize degradation of the performance of the apparatus.

In process P100, imaging data 1710 may be obtained and/or generated for all the mirrors of the pupil facet mirrors. In an embodiment, the imaging data 1710 may include a collection of a far field aerial image produced by one or more mirrors of the pupil facet mirrors (as discussed earlier) corresponding to a mask that may be used during the patterning process. In an embodiment, such imaging data may be obtained, for example, by modeling and/or simulation of projection optics model/aerial image model/patterning process using a computation tool (e.g. Tachyon tool). In an embodiment, optionally, pupil rendering may be performed (e.g., using calibrated Zeiss predictor) to obtain an accurate imaging data.

Based on the imaging data 1710, in process P200, a reference performance 1720 may be obtained and/or generated corresponding to a parameter (e.g., CD, overlay) of the patterning process. For example, the image data corresponding to each of the pupil facet mirror may be superimposed (or combined/added) to obtain a reference image. On the reference image, the reference performance 1720 (e.g., CD) may be measured and/or obtained.

In an embodiment, the processes P100 and P200 may be performed off line, for example, at a step up stage of an apparatus.

During production, in process P300, measurements 1730 of pupil facet mirror may be obtain from a pupil measurement metrology tool (e.g., LEUP) that measures pupil related parameter such as an intensity of each of the pupil facet mirrors at the wafer level. Such measurements may indicate that one or more mirrors of the pupil facet mirrors may have intensity different from, for example, an ideal intensity/desired intensity/starting intensity (e.g., as used in process P100) used to obtain the reference image data. For example, one or more mirrors may be dark (i.e., having approximately zero intensity), one or more mirrors may have low intensity (e.g., less than 25% of a full intensity initially set in process P100) or medium intensity (e.g., approximately 50% of the full intensity), and so on. Such variation in intensity of the pupil facet mirrors may be due to degradation of the pupil facet mirrors. The degradation may be due to, for example, collector degradation in EUV lithography or simply due to repeated use of the pupil mirrors. Hence, a degraded performance of the apparatus may be observed that causes the parameter, e.g., CD to vary from a desired/design intent.

Based on the measurement data 1730, in process P400, imaging data 1740 may be obtained and/or generated, by modeling/or simulation, similar to that in process P100. Depending on the measurements of each mirror of the pupil facet mirror, the image data per mirror may vary, for example, as a function of the intensity of the pupil facet mirror. For example, if a mirror has zero intensity, no image may be generate, if a mirror has low intensity, an image may be distorted, or other deformations may be observed in the image data of each image corresponding to the pupil facet mirror. Such imaging data when superimposed to generate a far field aerial image, which may not match the reference image. Based on such imaging data 1740, the performance 1742 (e.g., CD) of the apparatus may be measured and/or obtained. Such performance may be different from the reference performance 1720.

Furthermore, in process P500, a difference in the performance 1742 and the reference performance 1720 may be computed and/or obtained. Based on the difference, in process P600, a matching pupil 1760 may be determined. Determination of the matching pupil 1760 may involve an adjustment/correction to one or more mirror of the list of mirrors so as to reduce, preferably minimize the difference in the performance and the reference performance. The process P600 may be an iterative process (similar to the process P50 discussed above) involving several optimization steps during a simulation process.

In each iteration, the process P600 may include changing one or more degrees of freedom of the pupil facet mirrors and computing, via modeling/simulation, a current aerial image and a current performance based on the changed pupil facet mirrors. Further, a current difference between the current performance and the reference performance may be determined. In an embodiment, for each iteration, the change may include adjustment/correction to an orientation (e.g., an x/y coordinate, tilt, etc.) of the mirror of one or more mirrors having low intensity to zero intensity and the current CD may be determined for the change. Then, based on the CD, a difference in the computed CD and the reference CD may be obtained. Further, from these iterations, list of mirrors having minimum difference in CD may be selected as the matching pupil 1760, in a similar manner as discussed with respect to the process P50 above. In an embodiment, the optimization or selection of the list of the mirrors may be based on Monte Carlo or Branch Bound algorithms.

Furthermore, the above methods may include a process of adjusting the performance of the apparatus based on the matching pupil of the apparatus of the patterning process. For example, the adjusting of the critical dimension or an overlay can performed by modifying an intensity of one or more mirrors of the apparatus according to the matching pupil determined herein.

Figure 12A:
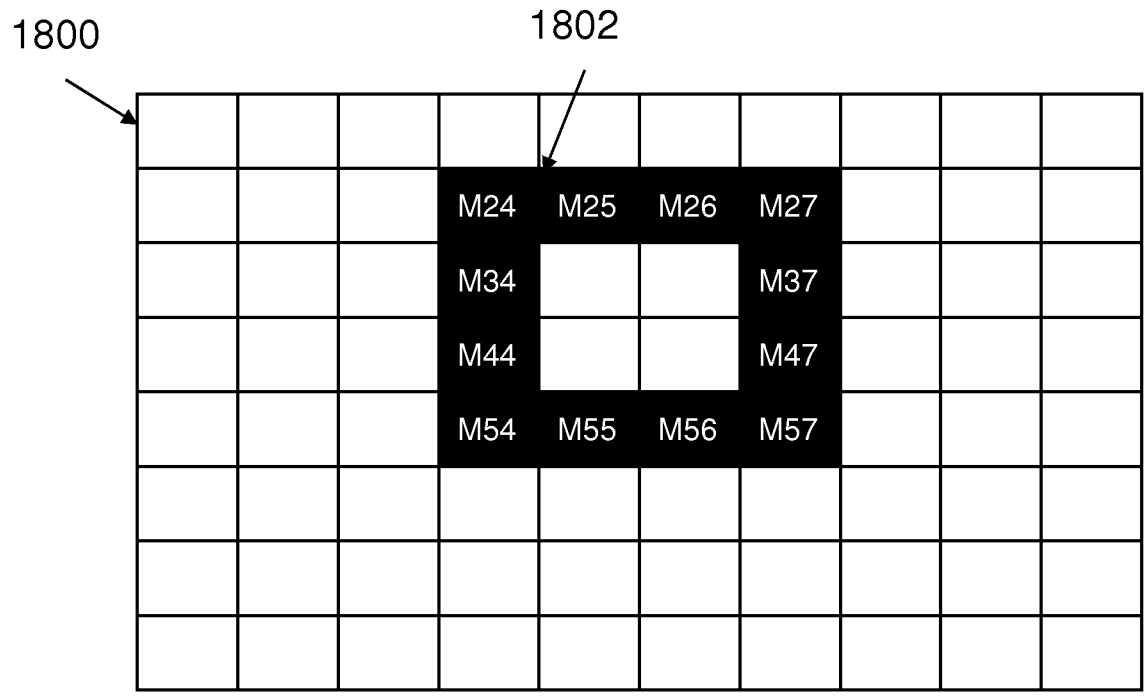
FIG. 12A illustrates an example reference pupil according to an embodiment.
Figure 12B:
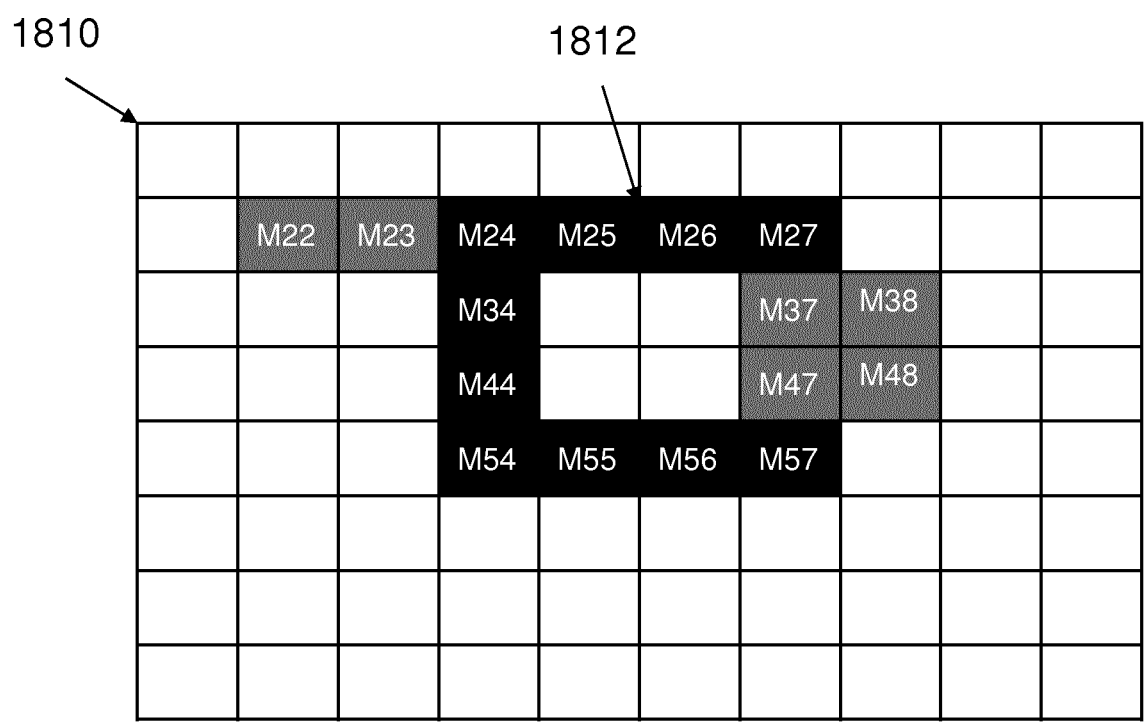
FIG. 12B illustrates an example matching pupil according to an embodiment.

FIGS. 12A and 12B illustrate an example reference pupil 1802 on the pupil facet mirrors 1800 (e.g., of the reference apparatus) and a matching pupil 1812 on the pupil facet mirrors 1810 (e.g., of the apparatus), respectively. In FIG. 12A, the reference pupil 1802 may include an array of mirrors with most mirrors having a high intensity (e.g., approximately 100%), except mirrors M24, M25, M26, M27, M34, M37, M44, M47, M54, M55, M56, and M57 that have approximately zero intensity (i.e., dark). Such reference pupil may generate a reference performance as discussed earlier with respect to FIGS. 10 and 11.

However, after performing the method of FIGS. 10 and/or 11, a matching pupil (e.g., matching pupil 1812) may be generated that enables close matching with the reference performance. The matching pupil may or may not (e.g., in ideal conditions) be different from the reference pupil 1812. The matching pupil 1812 appears different from the reference pupil 1802. The matching pupil 1812 may include most mirrors having high intensity (e.g., 1), mirrors M22, M23 M37, M38, M47, and M48 have medium intensity (e.g., in the range 40%-60% or in general lower than high intensity but greater than zero), and mirrors M24, M25, M26, M27, M34, M44, M54, M55, M56, and M57 may have approximately zero intensity (i.e., dark). As shown in the example, the generation of the matching pupil 1812 resulted in changes in intensities of some of the mirrors (i.e., M22, M23 M37, M38, M47, M48) compared to the reference pupil 1802.

In an embodiment, there is provided a method for reducing apparatus performance variation. The method includes obtaining (i) a reference performance of a reference apparatus, (ii) a set of initial leading degrees of freedom selected from a plurality of degrees of freedom of a plurality of pupil facet mirrors of an apparatus that is selected to reproduce the reference performance, and (iii) exposure data related to one or more parameters of the patterning process indicating a performance of the apparatus based on the set of initial leading degrees of freedom; and determining, by a computer system, a matching pupil of the apparatus based on the set of initial leading degrees of freedom and the exposure data such that the matching pupil reduces a difference between the performance of the apparatus and the reference performance.

In an embodiment, the matching pupil is a subset and/or entire set of the plurality of pupil facet mirrors corresponding to the set of initial leading degrees of freedom.

In an embodiment, the determining of the matching pupil is an iterative process, an iteration includes changing one or more degrees of freedom of the set of leading degrees of freedom of the plurality of pupil facet mirrors based on a difference between the performance of the apparatus and the reference performance; obtaining a current performance from the exposure data corresponding to the changed pupil facet mirrors; and determining a current difference between the current performance and the reference performance.

In an embodiment, the changing one or more degrees of freedom include a change in orientation and/or intensity of one or more mirrors corresponding to the set of leading degrees of freedom.

In an embodiment, the set of initial leading degrees of freedom is selected based on a sensitivity of each degree of freedom of the degrees of the plurality of pupil facet mirrors of the apparatus to reproduce the reference performance. In an embodiment, the set of initial leading degrees of freedom is a subset and/or an entire set of the plurality of degrees of freedom of the plurality of pupil facet mirrors the apparatus that matches the reference performance.

In an embodiment, the exposure data is obtained for a linear combination of the set of initial leading degrees of freedom.

In an embodiment, the reference performance is a performance of the reference apparatus different from the apparatus. In an embodiment, the reference performance is a performance of the apparatus determined at a particular time of the patterning process. In an embodiment, the performance of the apparatus and the reference performance of the reference apparatus are related to a parameter of the patterning process including critical dimension and/or overlay.

In an embodiment, the matching pupil minimizes the difference between the performance of the apparatus and the reference performance.

In an embodiment, the method further includes adjusting the performance of the apparatus based on the matching pupil of the apparatus of the patterning process.

In an embodiment, the apparatus of the patterning process is a lithographic apparatus.

Furthermore, according to an embodiment, there is provided a method for reducing apparatus performance variation. The method includes obtaining (i) a reference performance of a reference apparatus, and (ii) pupil measurements of a mirror of a plurality of pupil facet mirrors of an apparatus at a substrate level, determining, by a computer system, imaging data based on the pupil measurements and a performance based on the imaging data; and determining, by the computer system, a matching pupil of the apparatus such that the matching pupil reduces a difference between the performance of the apparatus and the reference performance.

In an embodiment, the determining of the matching pupil is an iterative process, an iteration includes changing one or more degrees of freedom of the plurality of pupil facet mirrors; computing, via modeling/simulation, a current aerial image and a current performance based on the changed pupil facet mirrors; and determining a current difference between the current performance and the reference performance.

In an embodiment, the changing one or more degrees of freedom include a change in orientation and/or intensity of one or more mirrors of the plurality of pupil facet mirrors.

In an embodiment, the pupil measurements include intensity and/or orientation of one or more mirrors of the plurality of pupil facet mirrors.

In an embodiment, the reference performance is measured from a reference imaging data for a reference apparatus, the reference apparatus being different from the apparatus. In an embodiment, the reference performance is a measured from a reference imaging data for the apparatus determined at a particular time of the patterning process.

In an embodiment, the reference imaging data is generated by superimposing aerial images of each mirror of the plurality of pupil facet mirror.

In an embodiment, the aerial images are generated, by modeling and/or simulation, for a far field location at a substrate level.

In an embodiment, the imaging data is generated by superimposing aerial images of each mirror of the plurality of pupil facet mirror, the aerial image being computed based on the intensity measurement of each mirror of the plurality of pupil facet mirrors.

In an embodiment, the performance and the reference performance are related to a parameter of the patterning process including critical dimension and/or overlay.

In an embodiment, the matching pupil minimizes the difference between the performance of the apparatus and the reference performance.

In an embodiment, the method further includes adjusting the performance of the apparatus based on the matching pupil of the apparatus of the patterning process.

In an embodiment, the apparatus of the patterning process is a lithographic apparatus.

Figure 13:
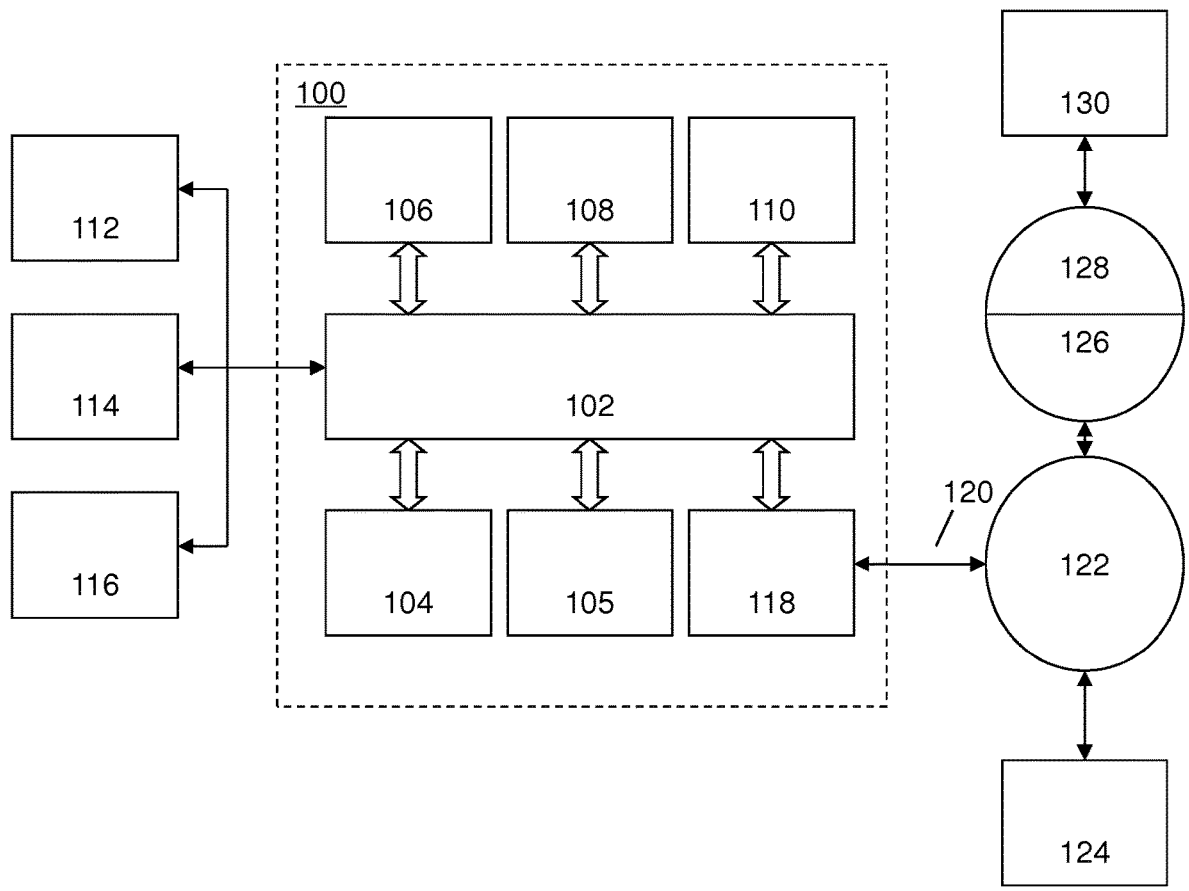
FIG. 13 is a block diagram of an example computer system.

FIG. 13 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

The embodiments may further be described using the following clauses:

1. A method for reducing apparatus performance variation, the method comprising:

obtaining (i) a reference performance of a reference apparatus, (ii) a set of initial leading degrees of freedom selected from a plurality of degrees of freedom of a plurality of pupil facet mirrors of an apparatus that is selected to reproduce the reference performance, and (iii) exposure data related to one or more parameters of the patterning process indicating a performance of the apparatus based on the set of initial leading degrees of freedom; and determining, by a computer system, a matching pupil of the apparatus based on the set of initial leading degrees of freedom and the exposure data such that the matching pupil reduces a difference between the performance of the apparatus and the reference performance.

2. The method according to clause 1, wherein the matching pupil is a subset and/or entire set of the plurality of pupil facet mirrors corresponding to the set of initial leading degrees of freedom.

3. The method of any of clauses 1 to 2, wherein the determining of the matching pupil is an iterative process, an iteration comprising:

changing one or more degrees of freedom of the set of leading degrees of freedom of the plurality of pupil facet mirrors based on a difference between the performance of the apparatus and the reference performance;

obtaining a current performance from the exposure data corresponding to the changed pupil facet mirrors; and determining a current difference between the current performance and the reference performance.

4. The method according to clause 3, wherein the changing one or more degrees of freedom include a change in orientation and/or intensity of one or more mirrors corresponding to the set of leading degrees of freedom.

5. The method of any of clauses 1 to 4, wherein the set of initial leading degrees of freedom is selected based on a sensitivity of each degree of freedom of the degrees of the plurality of pupil facet mirrors of the apparatus to reproduce the reference performance.

6. The method of any of clauses 1 to 5, wherein the set of initial leading degrees of freedom is a subset and/or an entire set of the plurality of degrees of freedom of the plurality of pupil facet mirrors of the apparatus to reproduce the reference performance.

7. The method of any of clauses 1 to 6, wherein the exposure data is obtained for a linear combination of the set of initial leading degrees of freedom.

8. The method of any of clauses 1 to 7, wherein the reference performance is a performance of the reference apparatus different from the apparatus.

9. The method of any of clauses 1 to 7, wherein the reference performance is a performance of the apparatus determined at a particular time of the patterning process.

10. The method of any of clauses 1 to 9, wherein the performance of the apparatus and the reference performance of the reference apparatus are related to a parameter of the patterning process including critical dimension and/or overlay.

11. The method of any of clauses 1 to 10, wherein the matching pupil minimizes the difference between the performance of the apparatus and the reference performance.

12. The method according clause 1, further comprising adjusting the performance of the apparatus based on the matching pupil of the apparatus of the patterning process.

13. The method according clause 12, wherein the apparatus of the patterning process is a lithographic apparatus.

14. A method for reducing apparatus performance variation, the method comprising:

obtaining (i) a reference performance of a reference apparatus, and (ii) pupil measurements of a mirror of a plurality of pupil facet mirrors of an apparatus at a substrate level, determining, by a computer system, imaging data based on the pupil measurements and a performance based on the imaging data; and determining, by the computer system, a matching pupil of the apparatus such that the matching pupil reduces a difference between the performance of the apparatus and the reference performance.

15. The method according to clause 14, wherein the determining of the matching pupil is an iterative process, an iteration comprising:

changing one or more degrees of freedom of the plurality of pupil facet mirrors;

computing, via modeling/simulation, a current aerial image and a current performance based on the changed pupil facet mirrors; and determining a current difference between the current performance and the reference performance.

16. The method according to clause 15, wherein the changing one or more degrees of freedom include a change in orientation and/or intensity of one or more mirrors of the plurality of pupil facet mirrors.

17. The method of any of clauses 14 to 16, wherein the pupil measurements include intensity and/or orientation of one or more mirrors of the plurality of pupil facet mirrors.

18. The method of any of clauses 14 to 17, wherein the reference performance is measured from a reference imaging data for a reference apparatus, the reference apparatus being different from the apparatus.

19. The method of any of clauses 14 to 18, wherein the reference performance is a measured from reference imaging data for the apparatus determined at a particular time of the patterning process.

20. The method of any of clauses 18 to 19, wherein the reference imaging data is generated by superimposing aerial images of each mirror of the plurality of pupil facet mirror.

21. The method according to clause 20, wherein the aerial images are generated, by modeling and/or simulation, for a far field location at a substrate level.

22. The method according to clause 14, wherein the imaging data is generated by superimposing aerial images of each mirror of the plurality of pupil facet mirror, the aerial image being computed based on the intensity measurement of each mirror of the plurality of pupil facet mirrors.

23. The method of any of the clauses 14 to 22, wherein the performance and the reference performance are related to a parameter of the patterning process including critical dimension and/or overlay.

24. The method according to any of clauses 14 to 20, wherein the matching pupil minimizes the difference between the performance of the apparatus and the reference performance.

25. The method according clause 14, further comprising adjusting the performance of the apparatus based on the matching pupil of the apparatus of the patterning process.

26. The method according clause 25, wherein the apparatus of the patterning process is a lithographic apparatus.

27. A computer program product comprising a computer readable medium having instructions recorded thereon, the instructions when executed by a computer implementing method of clauses 1 to 26.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, change in order or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While specific embodiments of the disclosure have been described above, it will be appreciated that the embodiments may be practiced otherwise than as described.

What is claimed is:

1. A method for reducing apparatus performance variation, the method comprising:
obtaining (i) a reference performance of a reference apparatus, (ii) a set of initial leading degrees of freedom selected from a plurality of degrees of freedom of a plurality of pupil facet mirrors of an apparatus, the plurality of degrees of freedom selected to reproduce the reference performance, and (iii) exposure data related to one or more parameters of the patterning process indicating a performance of the apparatus based on the set of initial leading degrees of freedom; and
determining, by a hardware computer system, a matching pupil of the apparatus based on the set of initial leading degrees of freedom and the exposure data such that the matching pupil reduces a difference between the performance of the apparatus and the reference performance.

2. The method according to claim 1, wherein the matching pupil is a subset and/or entire set of the plurality of pupil facet mirrors corresponding to the set of initial leading degrees of freedom.

3. The method of claim 1, wherein the determining of the matching pupil is an iterative process, an iteration comprising:
changing one or more degrees of freedom of the set of leading degrees of freedom of the plurality of pupil facet mirrors based on a difference between the performance of the apparatus and the reference performance;
obtaining a current performance from exposure data corresponding to the changed pupil facet mirrors; and
determining a current difference between the current performance and the reference performance.

4. The method according to claim 3, wherein the changing one or more degrees of freedom include a change in orientation of one or more mirrors corresponding to the set of leading degrees of freedom and/or a change in intensity of radiation associated with one or more mirrors corresponding to the set of leading degrees of freedom.

5. The method of claim 1, wherein the set of initial leading degrees of freedom is selected based on a sensitivity of each degree of freedom of the degrees of the plurality of pupil facet mirrors of the apparatus to reproduce the reference performance.

6. The method of claim 1, wherein the set of initial leading degrees of freedom is a subset and/or an entire set of the plurality of degrees of freedom of the plurality of pupil facet mirrors of the apparatus to reproduce the reference performance.

7. The method of claim 1, wherein the exposure data is obtained for a linear combination of the set of initial leading degrees of freedom.

8. The method of claims 1, wherein the reference performance is a performance of the reference apparatus different from the apparatus.

9. The method of claim 1, wherein the reference performance is a performance of the apparatus determined at a particular time of the patterning process.

10. The method of claim 1, wherein the performance of the apparatus and the reference performance of the reference apparatus are related to a parameter of the patterning process including critical dimension and/or overlay.

11. The method of claim 1, wherein the matching pupil minimizes the difference between the performance of the apparatus and the reference performance.

12. The method according to claim 1, further comprising adjusting the performance of the apparatus based on the matching pupil of the apparatus of the patterning process.

13. The method according to claim 12, wherein the apparatus of the patterning process is a lithographic apparatus.

14. A computer program product comprising a non-transitory computer-readable medium having instructions therein, the instructions, when executed by a computer system, configured to cause the computer system to at least:
obtain (i) a reference performance of a reference apparatus, (ii) a set of initial leading degrees of freedom selected from a plurality of degrees of freedom of a plurality of pupil facet mirrors of an apparatus, the plurality of degrees of freedom selected to reproduce the reference performance, and (iii) exposure data related to one or more parameters of the patterning process indicating a performance of the apparatus based on the set of initial leading degrees of freedom; and
determine a matching pupil of the apparatus based on the set of initial leading degrees of freedom and the exposure data such that the matching pupil reduces a difference between the performance of the apparatus and the reference performance.

15. The computer program product of claim 14, wherein the matching pupil is a subset and/or entire set of the plurality of pupil facet mirrors corresponding to the set of initial leading degrees of freedom.

16. The computer program product of claim 14, wherein instructions are further configured to cause the computer system to select the set of initial leading degrees of freedom based on a sensitivity of each degree of freedom of the degrees of the plurality of pupil facet mirrors of the apparatus to reproduce the reference performance.

17. The computer program product of claim 14, wherein the instructions configured to cause the computer system to determine the matching pupil are configured to do so in an iterative process, an iteration comprising:
change of one or more degrees of freedom of the set of leading degrees of freedom of the plurality of pupil facet mirrors based on a difference between the performance of the apparatus and the reference performance;
obtaining of a current performance from exposure data corresponding to the changed pupil facet mirrors; and
determination of a current difference between the current performance and the reference performance.

18. The computer program product of claim 14, wherein the performance of the apparatus and the reference performance of the reference apparatus are related to a parameter of the patterning process including critical dimension and/or overlay.

19. The computer program product of claim 14, wherein the exposure data is obtained for a linear combination of the set of initial leading degrees of freedom.

20. The computer program product of claim 14, wherein the instructions are further configured to cause the computer system to adjust the performance of the apparatus based on the matching pupil of the apparatus of the patterning process.

* * * * *